US007898469B2

(12) United States Patent
Ujita et al.

(10) Patent No.: US 7,898,469 B2
(45) Date of Patent: Mar. 1, 2011

(54) RECEIVING DEVICE FOR SPREAD SPECTRUM RADAR APPARATUS

(75) Inventors: Shinji Ujita, Osaka (JP); Takeshi Fukuda, Osaka (JP)

(73) Assignee: Panasonic Corporation, Osaka (JP)

( * ) Notice: Subject to any disclaimer, the term of this patent is extended or adjusted under 35 U.S.C. 154(b) by 211 days.

(21) Appl. No.: 12/237,697

(22) Filed: Sep. 25, 2008

(65) Prior Publication Data
US 2009/0091491 A1   Apr. 9, 2009

(30) Foreign Application Priority Data
Oct. 4, 2007   (JP) ................................. 2007-261087

(51) Int. Cl.
*G01S 7/285* (2006.01)
*G01S 13/00* (2006.01)

(52) U.S. Cl. ........... 342/194; 342/89; 342/118; 342/134; 342/135; 342/145; 342/175; 342/195

(58) Field of Classification Search .......... 375/130–153; 342/27, 28, 70–72, 82–103, 118, 127, 134–145, 342/175, 189–197, 200–205, 21, 61, 146, 342/147
See application file for complete search history.

(56) References Cited

U.S. PATENT DOCUMENTS

| | | | | |
|---|---|---|---|---|
| 4,053,889 A * | 10/1977 | Johnson | ........................ | 342/201 |
| 4,357,610 A * | 11/1982 | Kingston et al. | ................ | 342/21 |
| 4,443,799 A * | 4/1984 | Rubin | ........................... | 342/201 |
| 4,679,048 A * | 7/1987 | Brandsetter et al. | ............ | 342/61 |
| 4,758,839 A * | 7/1988 | Goebel et al. | ................. | 342/145 |
| 5,184,135 A * | 2/1993 | Paradise | ........................ | 342/189 |
| 5,495,500 A * | 2/1996 | Jovanovich et al. | .......... | 375/147 |
| 5,724,041 A * | 3/1998 | Inoue et al. | ..................... | 342/70 |
| 5,828,333 A * | 10/1998 | Richardson et al. | ............ | 342/70 |
| 6,031,485 A * | 2/2000 | Cellai et al. | .................... | 342/135 |
| 6,211,812 B1 * | 4/2001 | Chiles et al. | .................. | 342/145 |
| 6,278,397 B1 * | 8/2001 | Chiles et al. | .................. | 342/145 |
| 6,424,289 B2 * | 7/2002 | Fukae et al. | .................... | 342/27 |
| 6,657,579 B2 * | 12/2003 | Tsunehara et al. | ............ | 342/175 |

(Continued)

FOREIGN PATENT DOCUMENTS

JP   2005-72735 A   3/2005

OTHER PUBLICATIONS

English language Abstract of JP 2005-72735 A.

*Primary Examiner* — Bernarr E Gregory
(74) *Attorney, Agent, or Firm* — Greenblum & Bernstein P.L.C.

(57) ABSTRACT

Provided is a receiving device that is used for a spread spectrum radar apparatus, receives a spectrum-spread signal, and obtains a precise radar spectrum, and includes: a despreading unit that (i) generates first and second despread signals that are generated by despreading a reception signal using a pseudo-noise code, the second despread signal passing through a transmission line carrying a current having a current value identical to a current value of a current carried by a transmission line through which the first despread signal passes, and (ii) includes a first transistor pair including first and second transistors having an identical characteristic, the first transistor outputting the first despread signal, and the second transistor outputting the second despread signal; and a quadrature demodulating unit that generates an in-phase signal and a quadrature signal by quadrature-demodulating the first despread signal and the second despread signal, respectively.

11 Claims, 10 Drawing Sheets

U.S. PATENT DOCUMENTS

| | | | |
|---|---|---|---|
| 6,801,153 B2 * | 10/2004 | Rauch et al. | 342/21 |
| 6,900,753 B2 * | 5/2005 | Tsunehara et al. | 342/195 |
| 7,642,952 B2 * | 1/2010 | Fukuda | 342/175 |
| 7,729,450 B2 * | 6/2010 | Thor et al. | 375/130 |
| 2006/0068748 A1 | 3/2006 | Irie et al. | |
| 2007/0109175 A1 * | 5/2007 | Fukuda | 342/134 |
| 2008/0204307 A1 | 8/2008 | Fukuda | |

* cited by examiner

RECEIVING DEVICE FOR SPREAD SPECTRUM RADAR APPARATUS

BACKGROUND OF THE INVENTION (1) Field of the Invention

The present invention relates to a receiving device to be used for a spread spectrum radar apparatus using a spread spectrum scheme, and particularly to a receiving device that can obtain a radar spectrum that is precise and has stable intensity without depending on a phase of a reception signal.

(2) Description of the Related Arts

In recent years, vehicles have been equipped with radar apparatuses for use in detecting objects, such as vehicles ahead and obstacles behind the vehicles. There are high expectations for such radar apparatuses in terms of improvements in safety, such as avoiding collision, and in convenience of drivers as represented by support for reverse driving operations. Thus, technical developments in radar apparatus to be mounted in vehicles (hereinafter referred to as in-vehicle radar apparatuses) have been active. One of the important tasks of in-vehicle radar apparatuses is to suppress the influence of radio waves to be emitted from radar apparatuses that are mounted in other vehicles and are similar to the radar apparatus of the own vehicle. As an example, radar apparatuses using a spread spectrum scheme (hereinafter referred to as spread spectrum radar apparatuses) have been suggested.

The spread spectrum radar apparatuses modulate emitted radio waves using pseudo-noise codes (hereinafter referred to as PN codes) for spreading waves. Receivers for such spread spectrum radar apparatuses despread waves reflected from objects, using the same PN codes that have been used in modulating the emitted radio waves. Thus, either radio waves that have been modulated using different codes or radio waves that have been emitted from radar apparatuses that use other schemes with no code modulation are suppressed in the receivers. Furthermore, since the emitted radio waves are frequency-spread using the PN codes, electric power on a frequency unit basis and the impact to other wireless systems can be reduced. Furthermore, a relationship between a distance resolution and a maximum detectable range may be freely set by adjusting chip rates and code cycles of the PN codes. Furthermore, the peak power never becomes large due to continuous transmission of radio waves.

FIG. 1 illustrates a configuration of a receiving unit 300 included in a receiving device of a conventional spread spectrum radar apparatus disclosed in Unexamined Japanese Patent Application Publication No. 2005-72735, published Mar. 17, 2005 (hereinafter referred to as Patent Reference 1). The receiving unit 300 includes a receiving antenna 301, a low noise amplifier 302, a despreading unit 303, a phase shifter 304, a quadrature demodulator 305, and buffer amplifiers 307a and 307b.

A transmission signal that has been spread over a wide band and then transmitted by a transmitting device is reflected from an object at a certain distance. The signal reflected from the object is received by the receiving antenna 301 of the receiving unit 300 in FIG. 1. The despreading unit 303 despreads the reflected signal using a PN code provided from a reception PN code generating unit 310 to the despreading unit 303, and converts the despread signal into a narrow-band signal. Then, the narrow-band signal is separated into 2 different narrow-band signals that pass through differential transmission lines that have a phase difference by 180 degrees. The 2 narrow-band signals are down-converted by balanced modulators 305a and 305b based on 2 different local oscillator signals in order to generate an in-phase signal and a quadrature signal respectively from the balanced modulators 305a and 305b. Here, the 2 different local oscillator signals have a phase difference by approximately 90 degrees and are generated by a local oscillator 306 and a phase shifter 304, respectively. A sum of squares of the in-phase signal and the quadrature signal is calculated to obtain intensity of the signals. Furthermore, a control unit (not illustrated) included in the receiving unit 300 controls how long a PN code identical to the PN code used in the transmitting device is delayed for use in the receiving unit 300. Furthermore, the signal processing unit 320 calculates a distance to the object by performing signal processing on the signal received by the receiving unit 300 so that the distance may be reflected to a radar spectrum.

FIG. 2 illustrates a circuit configuration, disclosed in Patent Reference 1, including the despreading unit 303 of the receiving unit 300 and the balanced modulators 305a and 305b included in the quadrature demodulator 305. The despreading unit 303 and the balanced modulators 305a and 305b are double balanced I/O switching circuits, and transistors included in amplifiers of Gilbert cell mixer circuits are omitted in FIG. 2. A current source circuit 331 can be commonly used by integrating the despreading unit 303, and the balanced modulators 305a and 305b into a circuit. Thereby, a current value of a current to be consumed can be reduced, and electric power consumption can also be reduced. Furthermore, reception signals provided from collectors of transistors included in the despreading unit 303 can be directly received by emitters of transistors included in the balanced modulators 305a and 305b. Thus, distortion effect can be suppressed and further, a size of a chip can be reduced.

FIG. 3 simply illustrates operations of the receiving unit 300 illustrated in FIG. 2. A reception signal is converted from an unbalanced signal into a balanced signal by a balun 330. As illustrated in FIG. 3, currents A and B are carried by balanced output transmission lines of the balun 330. Furthermore, transistors Q1, Q7, Q9, Q12, Q13, and Q16 are turned on, and other transistors are turned off.

The current A flows through the transistor Q1, and the current B flows through the transistor Q7. Since the transistors Q9, Q12, Q13, and Q16 are turned on in the quadrature demodulator 305, the current A is made up of a current A1 that flows through the transistor Q9 and a current A2 that flows through the transistor Q13. The current B is made up of a current B1 that flows through the transistor Q12 and a current B2 that flows through the transistor Q16. Here, when the current A1 is equal to the current A2, intensity of a signal transmitted from a terminal OUT1 is equal to that of a signal transmitted from a terminal OUT3. When the current B1 is equal to the current B2, intensity of a signal transmitted from a terminal OUT2 is equal to that of a signal transmitted from a terminal OUT4. In other words, an in-phase balanced signal made up of the signals transmitted from the terminals OUT1 and OUT2 is equal to a quadrature balanced signal made up of the signals transmitted from the terminals OUT3 and OUT4. Hereinafter, processing for obtaining a radar spectrum is described more specifically using equations.

Equation 1 expresses 2 balanced signals RF1 and RF2 obtained through the despreading unit 303, and Equation 2 expresses local oscillator signals LO_I and LO_Q that have a phase difference by 90 degrees and that are provided by the quadrature demodulator 305.

$P_1$ and $P_2$ represent intensities of the balanced signals RF1 and RF2, and $\phi$ represents a phase of a reception signal RF. The reception signal RF is demodulated by the quadrature demodulator 305 based on the local oscillator signals LO_I and LO_Q.

$$RF1 = P_1 \cos(\omega_1 t + \phi) \quad \text{(Equation 1)}$$

$$RF2 = P_2 \cos(\omega_1 t + \phi + \pi) \quad \text{(Equation 2)}$$

$$LO\_I = \cos \omega_2 t$$

$$LO\_Q = \sin \omega_2 t$$

Equation 3 expresses an output in-phase signal IF_I and an output quadrature signal IF_Q obtained by removing a signal component having larger frequency through a filter from the demodulated reception signal RF.

$$IF\_I = (P_1/2) \cos\{(\omega_1 - \omega_2)t + \phi\} \quad \text{(Equation 3)}$$

$$IF\_Q = (P_2/2) \sin\{(\omega_1 - \omega_2)t + \phi\}$$

Equation 4 expresses a sum of squares T of the in-phase signal IF_I and the quadrature signal IF_Q.

$$T = \sqrt{[(P_1/2)^2 \cos^2\{(\omega_1-\omega_2)t+\phi\} + (P_2/2)^2 \sin^2\{(\omega_1-\omega_2)t+\phi\}]} \quad \text{(Equation 4)}$$

The sum of squares T reflects a peak of a radar spectrum. When the 2 balanced signals RF1 and RF2 obtained through the despreading unit 303 have different values representing the intensities $P_1$ and $P_2$, the sum of squares T of the in-phase signal IF_I and the quadrature signal IF_Q varies according to a phase $\phi$ of the reception signal RF. However, when the intensity $P_1$ is equal to that of $P_2$, the sum of squares T of the in-phase signal IF_I and the quadrature signal IF_Q becomes a constant value.

Here, the intensities $P_1$ and $P_2$ of the 2 balanced signals RF1 and RF2 obtained through the despreading unit 303 depend on a difference between current values of the currents A1 and B1 or a difference between current values of the currents A2 and B2. When absolute values of these two differences of the current values become equal, according to a result of Equation 4, the sum of squares T of the in-phase signal IF_I and the quadrature signal IF_Q becomes a constant value and can secure intensity of the reception signal RF at its peak.

SUMMARY OF THE INVENTION

However, such a conventional receiving device has a problem that current values of an in-phase balanced signal and a quadrature balanced signal are not stable and that a reception signal reflected from an object at a certain distance is not stable at its peak. In other words, since a sum of squares of the in-phase balanced signal and the quadrature balanced signal varies according to a phase $\phi$ of the reception signal RF, the reception signal reflected from the object at the certain distance is not stable at its peak and intensity of the reception signal RF varies.

More specifically, bases of the transistors Q9 and Q13 are not connected to each other in a conventional circuit structure. Thus, due to the impact of matching a voltage in a latter circuit to a voltage in a former circuit, local oscillator signals LO1 and LO3 differ in voltage level. In this case, base input voltages between the transistors Q9 and Q13 also become different. When a transistor is turned on, a base-emitter voltage is kept constant (normally, a voltage value varies depending on materials of the transistor or processes for manufacturing the transistor).

However, when the base-emitter voltage varies, a collector current also exponentially varies according to the base-emitter voltage. Thereby, assuming that a DC voltage level of the local oscillator signal LO1 increases and a DC voltage level of the local oscillator signal LO3 decreases, the base-emitter voltage of the transistor Q9 becomes higher than that of the transistor Q13 because emitters of the transistors Q9 and Q13 are connected to each other. Thus, the current A flows mostly through the transistor Q9, but hardly through the transistor Q13. Similarly, the current B flows mostly through the transistor Q12, but hardly through the transistor Q16.

As described above, in the case of A1≠A2 or B1≠B2, the intensities $P_1$ and $P_2$ have different values. Since a sum of squares expressed by Equation 4 varies according to a phase $\phi$ of the reception signal RF, the reception signal RF is not stable at its peak and intensity of the reception signal RF varies. In other words, when a voltage level of a signal received by a base of each transistor varies due to the influence such as noise, intensity of an output signal also varies and thus a precise radar spectrum cannot be obtained.

Thus, the present invention has been conceived in view of the problem, and aims at providing a receiving device that is used for a spread spectrum radar apparatus and stabilizes signal intensity by keeping constant a sum of squares of an in-phase signal and a quadrature signal without depending on a phase of a reception signal to obtain a precise radar spectrum.

In order to solve the problem, the receiving device according to the present invention is a receiving device that is used for a spread spectrum radar apparatus and receives a spectrum-spread signal, and includes: a signal receiving unit configured to receive the spectrum-spread signal as a reception signal; a despreading unit configured to generate a first despread signal and a second despread signal that are generated by despreading, using a pseudo-noise code, the reception signal received by the signal receiving unit, the second despread signal passing through a transmission line carrying a current having a current value identical to a current value of a current carried by a transmission line through which the first despread signal passes; and a quadrature demodulating unit configured to generate an in-phase signal by quadrature-demodulating the first despread signal, and a quadrature signal by quadrature-demodulating the second despread signal, wherein the despreading unit includes a first transistor pair including a first transistor and a second transistor, the first and second transistors having an identical characteristic, the first and second transistors receive the reception signal, and despread the received reception signal by being turned on and off according to the pseudo-noise code, subsequently the first transistor outputs the first despread signal, and the second transistor outputs the second despread signal, and the quadrature demodulating unit includes: a first demodulator that demodulates the first despread signal using a first local oscillator signal, and generates the in-phase signal; and a second demodulator that demodulates the second despread signal using a second local oscillator signal having a phase obtained by shifting a phase of the first local oscillator signal by 90 degrees, and generates the quadrature signal.

Thereby, a current value of the in-phase signal and a current value of the quadrature signal can be kept constant by keeping current values of lines through which the 2 signals that are despread and outputted from the despreading unit pass. Thus, a sum of squares of the in-phase signal and the quadrature signal can be kept constant, and a precise radar spectrum can be obtained.

Furthermore, the signal receiving unit may be configured to convert the received spectrum-spread signal into a balanced reception signal including a positive reception signal and a negative reception signal, the first despread signal may be a balanced signal including a first positive despread signal and a first negative despread signal, the second despread signal may be a balanced signal including a second positive despread signal and a second negative despread signal, the despreading unit may further include a second transistor pair having a structure identical to a structure of the first transistor pair, the first transistor pair may receive the positive reception signal, despread the received positive reception signal by being turned on and off according to the pseudo-noise code, and output the first positive despread signal and the second positive despread signal, and the second transistor pair may receive the negative reception signal, despread the received negative reception signal by being turned on and off according to the pseudo-noise code, and output the first negative despread signal and the second negative despread signal.

More preferably, the pseudo-noise code is a balanced pseudo-noise code including a positive pseudo-noise code and a negative pseudo-noise code, the despreading unit further includes a third transistor pair and a fourth transistor pair each having a structure identical to the structure of the first transistor pair, the first transistor pair despreads the positive reception signal by being turned on and off according to the positive pseudo-noise code, and outputs the first positive despread signal and the second positive despread signal, and the second transistor pair despreads the negative reception signal by being turned on and off according to the positive pseudo-noise code, and outputs the first negative despread signal and the second negative despread signal, and the third transistor pair receives the positive reception signal, despreads the received positive reception signal by being turned on and off according to the negative pseudo-noise code, and outputs the first negative despread signal and the second negative despread signal, and the fourth transistor pair receives the negative reception signal, despreads the received negative reception signal by being turned on and off according to the negative pseudo-noise code, and outputs the first positive despread signal and the second positive despread signal.

Thereby, the reception signal can be processed as a balanced signal, and influence of outside noise can be reduced.

Furthermore, the receiving device may include: a code generating unit configured to generate the pseudo-noise code; and an amplifier circuit that amplifies the pseudo-noise code and provides the amplified pseudo-noise code to the despreading unit.

Thereby, amplifying output intensity of a PN code can operate, in a saturation region, a transistor included in the despreading unit, and can obtain stable intensity of a reception signal. Furthermore, there is no need to install a large capacitor for removing a DC voltage component outside a chip.

The signal receiving unit may further include a balun that converts the received spectrum-spread signal into the balanced reception signal and provides the converted reception signal to the despreading unit, and the balun may include passive elements.

More specifically, the balun includes: a first transmission line having an end that receives the spectrum-spread signal that is an unbalanced signal, and having an other end that is grounded; and a second transmission line and a third transmission line that are electromagnetically coupled to the first transmission line, and an end of the second transmission line and an end of the third transmission line are grounded, the positive reception signal is outputted from an other end of the second transmission line, and the negative reception signal is outputted from an other end of the third transmission line, the other end of the second transmission line facing the other end of the third transmission line.

Thereby, compared to a case where a balun includes active elements such as transistors, the distortion of a reception signal provided as a balanced signal can be suppressed.

The receiving device may further include: a first capacitor coupled in parallel with an output transmission line of the first demodulator, the first capacitor removing a high frequency component from the in-phase signal; and a second capacitor coupled in parallel with an output transmission line of the second demodulator, the second capacitor removing a high frequency component from the quadrature signal.

Thereby, a high frequency component of a despread signal that has been passing through the receiving device without being despread by the despreading unit can be removed. Furthermore, the despread signal distorted by the high frequency component can be suppressed, and a demodulation signal can be prevented from peaking due to distortion in a radar spectrum.

Furthermore, the despreading unit and the quadrature demodulating unit may be integrated in a circuit that includes a current source to be shared between the despreading unit and the quadrature demodulating unit, and may be formed on an identical semiconductor substrate.

Thereby, a current source circuit that supplies a current can be shared between the despreading unit and the quadrature demodulating unit, and electric power to be consumed and a size of a chip can be reduced.

Furthermore, the first and second transistors may be hetero bipolar transistors. Thereby, the transistors can be used as a radar apparatus that can perform a higher-frequency operation.

The present invention can provide a receiving device that is used for a spread spectrum radar apparatus and can obtain a precise radar spectrum by stabilizing intensity of a reception signal through keeping constant a sum of squares of an in-phase signal and a quadrature signal that are provided from the quadrature demodulating unit, regardless of a phase of the reception signal.

FURTHER INFORMATION ABOUT TECHNICAL BACKGROUND TO THIS APPLICATION

The disclosure of Japanese Patent Application No. 2007-261087 filed on Oct. 4, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following describes embodiments of the present invention with reference to drawings.

First Embodiment

A receiving device for a spread spectrum radar apparatus of a first embodiment includes a despreading unit and a quadrature demodulating unit each of which is configured of a switching circuit that is a double balanced I/O circuit. The receiving device further includes a current power source circuit that is shared between the despreading unit and the quadrature demodulating unit. The despreading unit includes 4 transistor pairs each including 2 transistors. The receiving device has a circuit configuration in which 2 transistors included in a transistor pair are connected to each other through the respective bases and emitters. Current values of currents provided from the transistors are set to the same value. Furthermore, the receiving device is, for example, mounted in a moving object, such as a vehicle.

Figure 1:
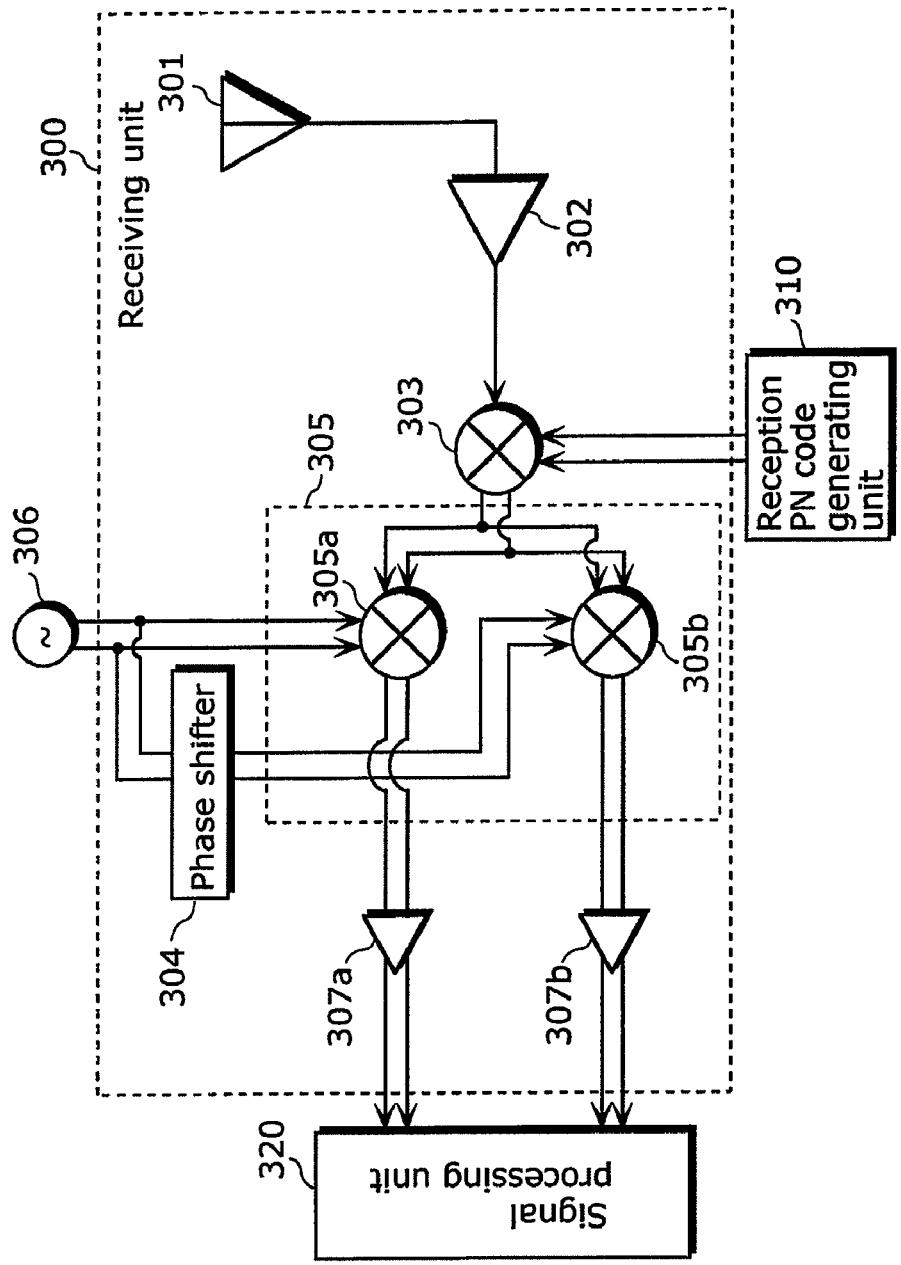
FIG. 1 illustrates a configuration of a receiving unit included in a conventional spread spectrum radar apparatus.
Figure 2:
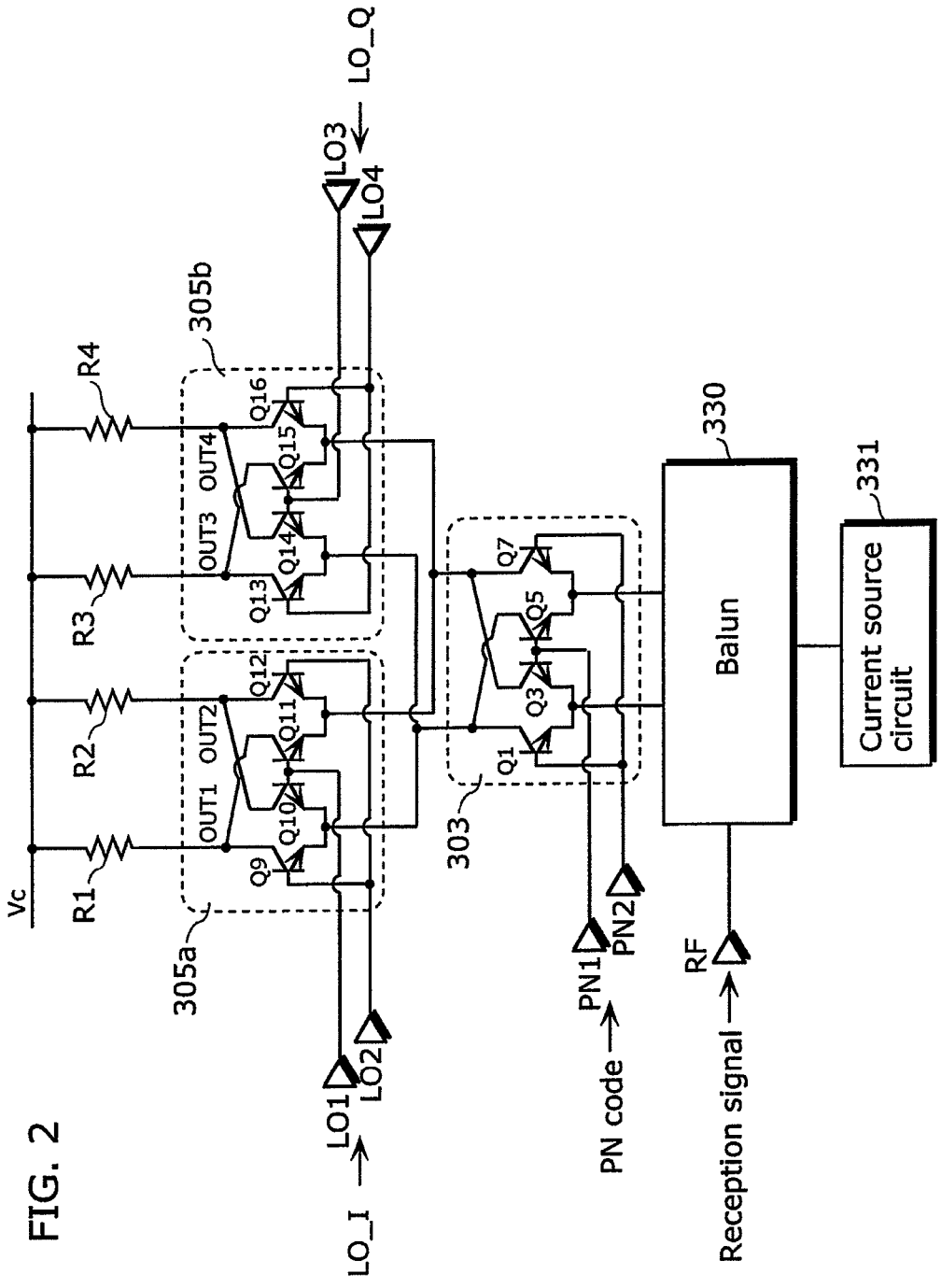
FIG. 2 illustrates a conventional circuit configuration including a despreading unit and a quadrature demodulator.
Figure 3:
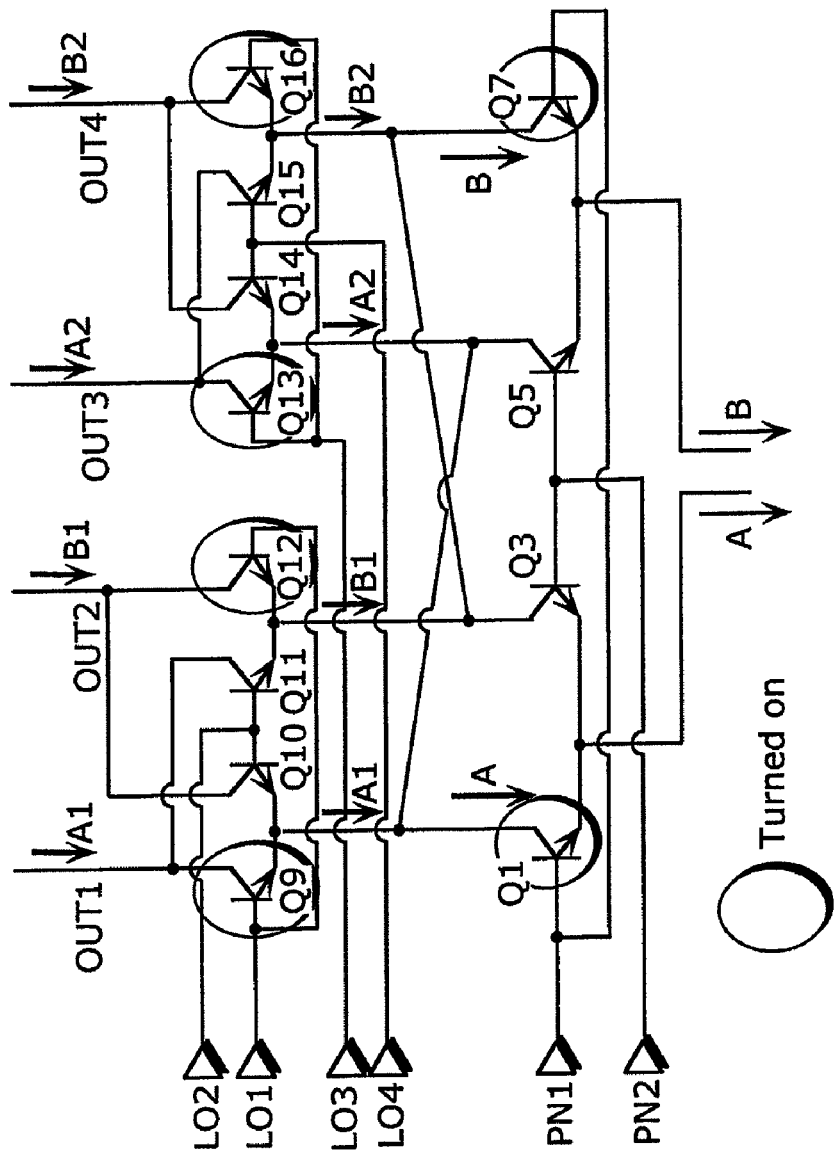
FIG. 3 simply illustrates a conventional operation of a despreading unit and a quadrature demodulator.
Figure 4:
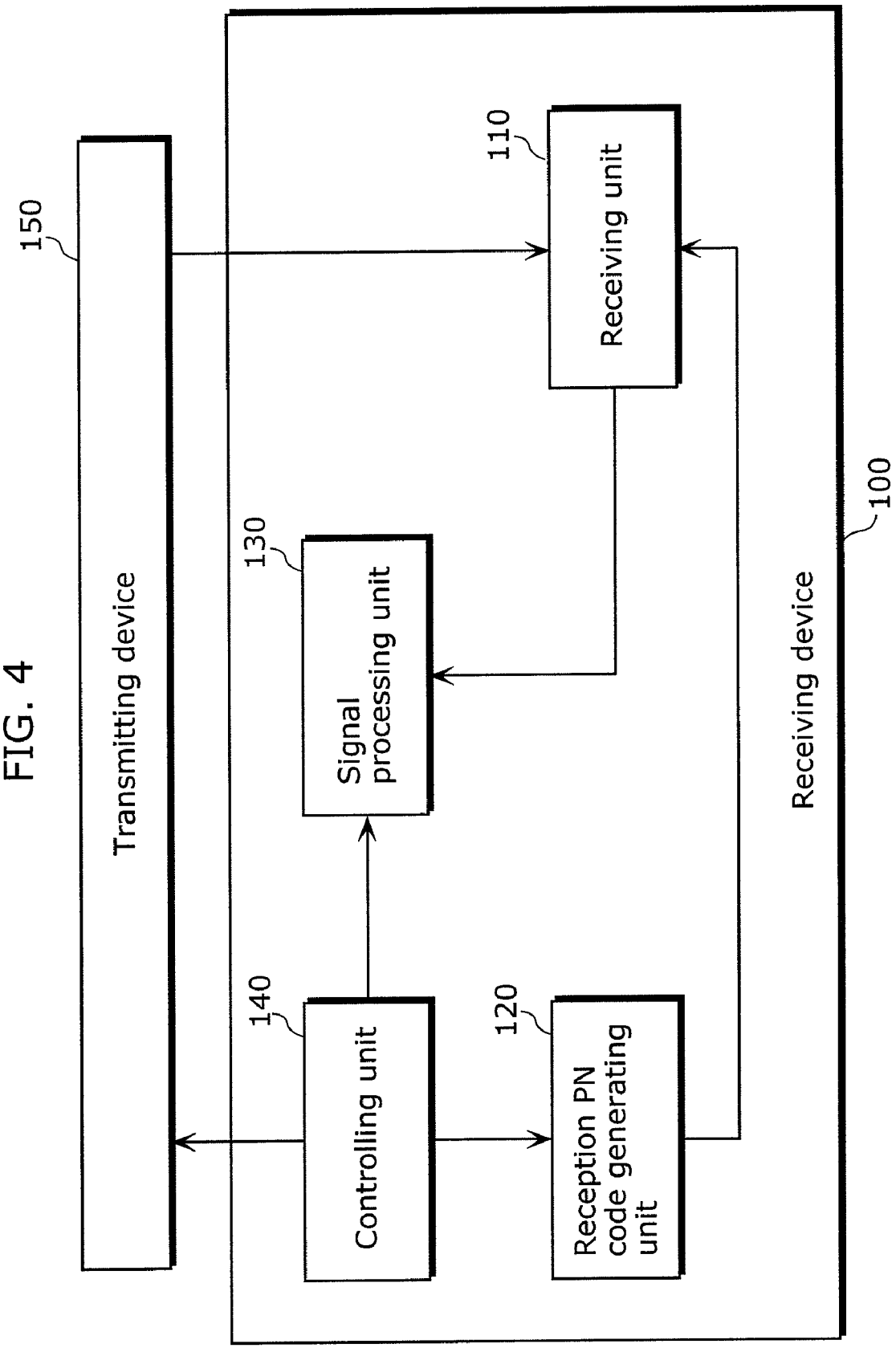
FIG. 4 schematically illustrates a configuration of a receiving device for a spread spectrum radar apparatus according to the first embodiment.

FIG. 4 schematically illustrates a configuration of a receiving device 100 for a spread spectrum radar apparatus of the first embodiment. The receiving device 100 receives a detection radio wave transmitted from a transmitting device 150 for the spread spectrum radar apparatus and then reflected from an object. Then, the receiving device 100 detects a distance from the moving object to the object and a relative velocity of the moving object with respect to the object, and other information by performing processing on the received detection radio wave. The receiving device 100 includes a receiving unit 110, a reception PN code generating unit 120, a signal processing unit 130, and a controlling unit 140.

The receiving unit 110 receives a detection radio wave reflected from an object from among detection radio waves transmitted from the transmitting device 150, and despreads and quadrature-demodulates the received detection radio wave. The configuration of the receiving unit 110 will be described later in detail.

The reception PN code generating unit 120 generates a PN code obtained by delaying a reception PN code generated by a transmission PN code generating unit (not illustrated) in the transmitting device 150, based on a timing signal supplied from the controlling unit 140, and provides the generated reception PN code to the receiving unit 110.

The signal processing unit 130 calculates the presence and absence of an object, a distance and a relative velocity to the object, and other information, based on a code delay time τ of the reception PN code generated by the reception PN code generating unit 120 for a transmission PN code generated by the transmission PN code generating unit, a reference signal provided from the transmitting device 150, and a signal provided from the receiving unit 110.

The controlling unit 140 supplies a timing signal to the reception PN code generating unit 120 and the transmission PN code generating unit.

Figure 5:
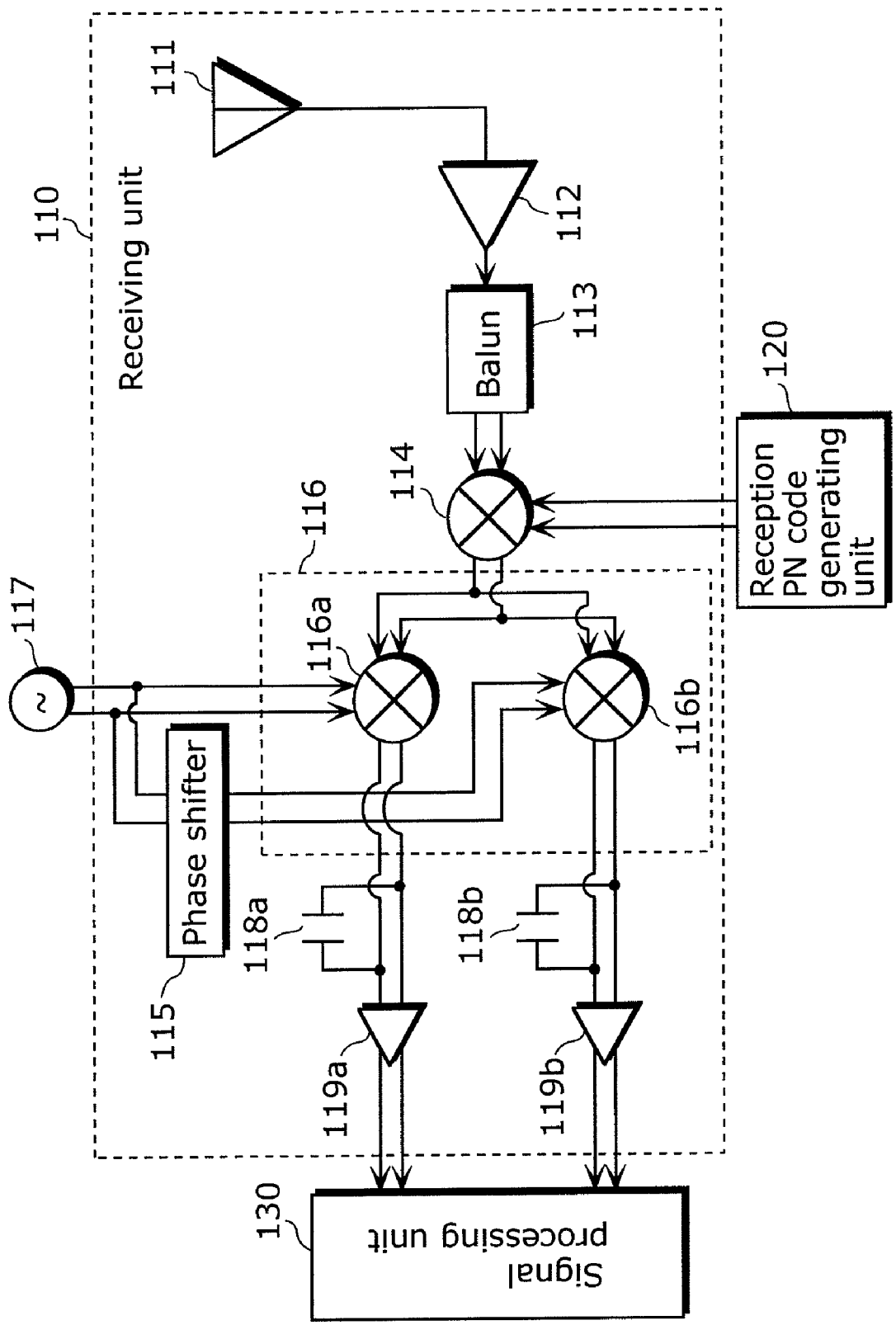
FIG. 5 illustrates a configuration of a receiving unit according to the first embodiment.

FIG. 5 illustrates a configuration of the receiving unit 110 of the receiving device 100 according to the first embodiment. The receiving unit 110 includes a reception antenna 111, a low noise amplifier 112, a balun 113, a despreading unit 114, a phase shifter 115, a quadrature demodulating unit 116, capacitors 118a and 118b, and buffer amplifiers 119a and 119b. Here, the signal receiving unit as one aspect of the present invention corresponds to a set of the reception antenna 111, the low noise amplifier 112, and the balun 113.

The reception antenna 111 receives a detection radio wave reflected from an object as a reception signal. In the first embodiment, a detection radio wave is spread, for example, over frequency bands of 26.4 GHz±1 MHz.

The low noise amplifier 112 is inserted as necessary in order to favorably maintain a ratio of a signal to noise. The low noise amplifier 112 is configured of a circuit made of a single wire.

Figure 6:
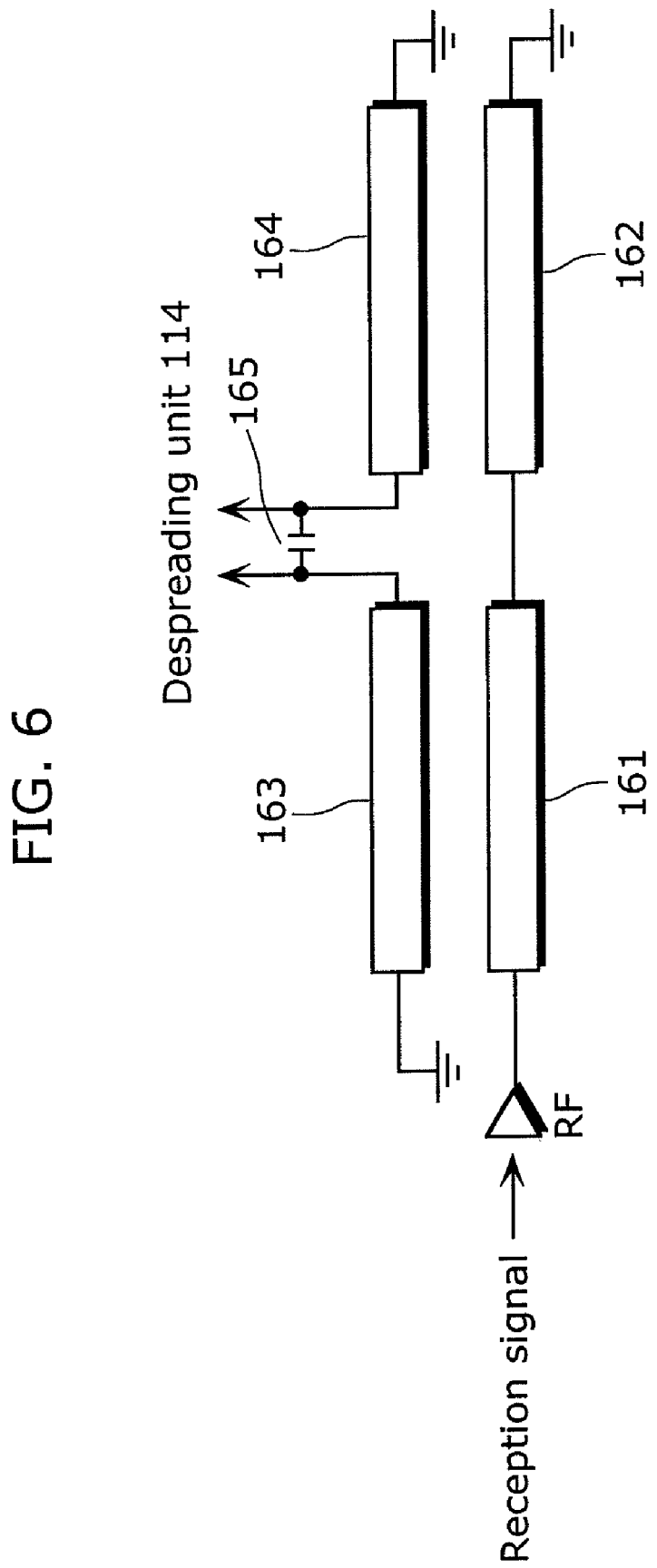
FIG. 6 illustrates a circuit configuration of a balun according to the first embodiment.

The balun 113 is a circuit that converts a reception signal received as an unbalanced signal into a balanced signal. FIG. 6 illustrates a circuit configuration of the balun 113. The balun 113 includes 4 transmission lines 161, 162, 163, and 164, and a capacitor 165. As illustrated in FIG. 6, distortion occurring in a reception signal can be prevented by using a balun only including passive elements.

The reception signal is provided to an end of the transmission line 161. The other end of the transmission line 161 is connected to an end of the transmission line 162. The other end of the transmission line 162 is grounded. Respective one ends of the transmission lines 163 and 164 are also grounded. The other ends of the transmission lines 163 and 164 are connected to the despreading unit 114. The transmission line 161 is electromagnetically coupled to the transmission line 163, and the transmission lines 162 is electromagnetically coupled to the transmission line 164. Thus, a reception signal provided to the transmission line 161 as an unbalanced signal is provided each from the other ends of the transmission lines 163 and 164 to the despreading unit 114 as a balanced signal. The capacitor 165 is coupled in parallel with the transmission lines 163 and 164 in order to match a voltage in the balun 113 and a voltage in the despreading unit 114.

The despreading unit 114 demodulates the reception signal converted into the balanced signal by the balun 113, using a reception PN code. When the code delay time τ of the reception PN code is equivalent to a delay time corresponding to a distance to an object to be detected, a phase of the reception PN code included in the received detection radio wave matches a phase of the reception PN code provided from the reception PN code generating unit 120, and the reception signal that has been spectrum spread over a wide band is despread by the despreading unit 114 over a narrow band. When the code delay time τ is different from the delay time corresponding to the distance to the object to be detected, a demodulation signal generated by the despreading unit 114 is kept spectrum spread over a wide band.

The phase shifter 115 generates a local oscillator signal having a phase obtained by shifting, by approximately 90 degrees, a phase of the local oscillator signal generated by a local oscillator 117. Here, the approximately 90 degrees ranges from 85 to 95 degrees.

Furthermore, frequencies of the local oscillator signal generated by the local oscillator 117 range from 20 to 30 GHz (for example, 26 GHz band) or from 30 to 100 GHz (for example, 60 GHz band or 76 GHz band).

The quadrature demodulating unit 116 includes balanced modulators 116a and 116b. The quadrature demodulating unit 116 converts, using a local oscillator signal, a demodulation signal provided from the despreading unit 114 into an in-phase signal and a quadrature signal each having an intermediate frequency. Here, the demodulation signal is a signal that has been despread.

The capacitors 118a and 118b are coupled in parallel with respective balanced lines between the balanced modulator 116a and the buffer amplifier 119a and between the balanced modulator 116b and the buffer amplifier 119b. The capacitors 118a and 118b can remove a high frequency component of a spread signal that has passed through the receiving device without being despread by the despreading unit 114. The spread signal including many frequency components is a signal having large amplitude with respect to temporal-spectrum axes. In particular, the stronger a signal from a reflector is, the larger amplitude of this spread signal becomes. Distortion occurs when this amplitude becomes larger than a 1 dB gain compression point in a circuit of the receiving device 100. When distortion occurs, the spread signal may be demodulated, and the demodulated signal may peak in a spectrum for detecting a distance to an object, at a distance where no object is actually present.

The buffer amplifiers 119a and 119b amplify signal intensity of the in-phase signal and the quadrature signal each having the intermediate frequency and each provided from the quadrature demodulating unit 116. Here, the amplified signals are provided to the signal processing unit 130, and the intensity of the signals is reflected to a radar spectrum.

Figure 7:
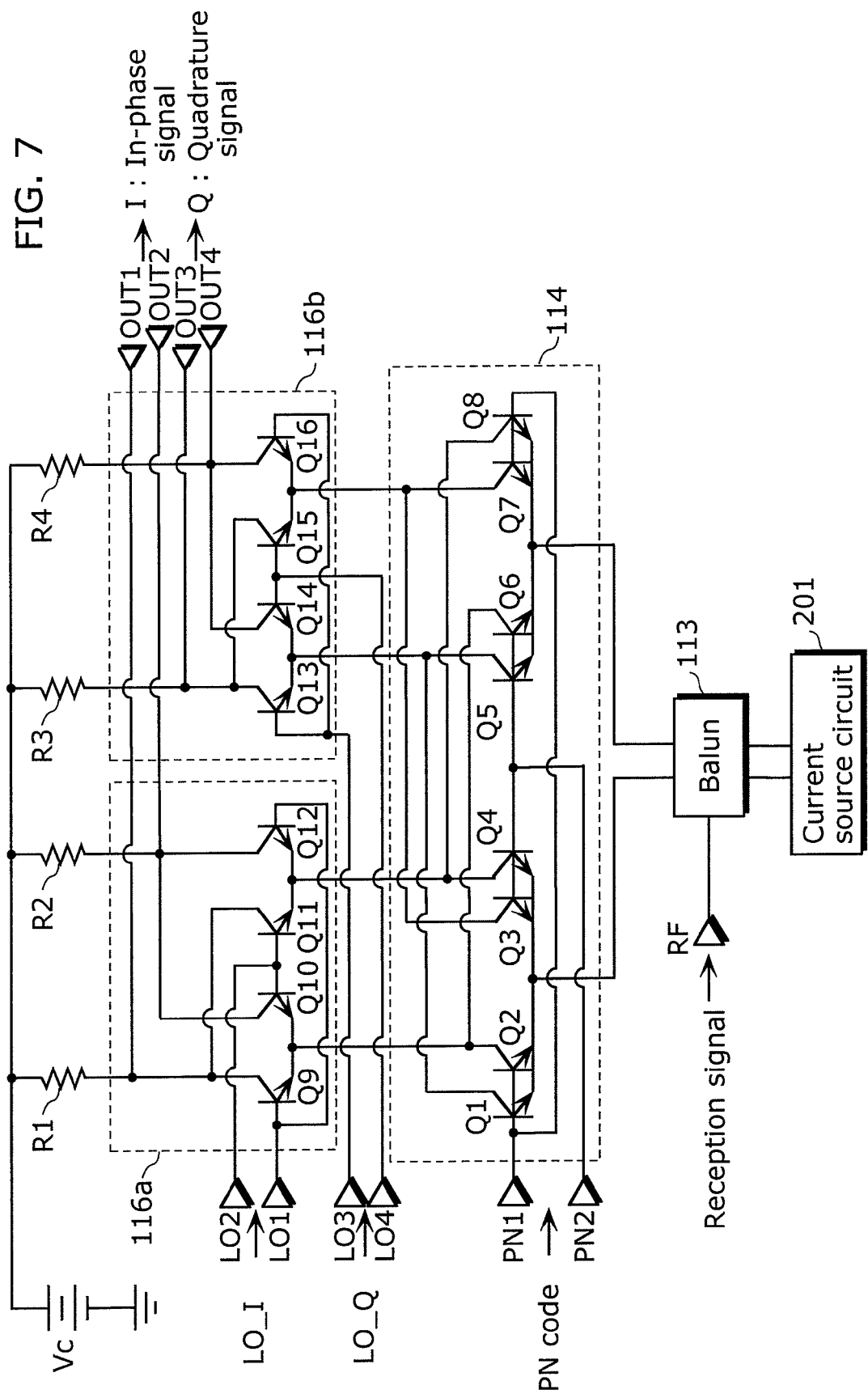
FIG. 7 illustrates a circuit configuration including a despreading unit and a quadrature demodulator according to the first embodiment.

FIG. 7 illustrates a circuit configuration of the despreading unit 114 and the quadrature demodulating unit 116 including the balanced modulators 116a and 116b that are illustrated in FIG. 5. The despreading unit 114 and the balanced modulators 116a and 116b are double balanced I/O switching circuits, and transistors included in amplifiers of Gilbert cell mixer circuits are omitted in FIG. 7.

The circuit in FIG. 7 includes 16 transistors Q1 to Q16, 4 resistors R1 to R4, and a direct current power source Vc. The despreading unit 114 includes, out of the 16 transistors Q1 to Q16, the 8 transistors including a transistor pair of the transistors Q1 and Q2, a transistor pair of the transistors Q3 and Q4, a transistor pair of the transistors Q5 and Q6, and a transistor pair of the transistors Q7 and Q8. The balanced modulator 116a includes the 4 transistors Q9 to Q12. The balanced modulator 116b includes the 4 transistors Q13 to Q16.

The transistors Q1 to Q4 have respective emitter terminals connected to one end of a balanced output transmission line of the balun 113. The transistors Q5 to Q8 have respective emitter terminals connected to the other end of the balanced output transmission line of the balun 113. The transistors Q1, Q2, Q7, and Q8 have respective base terminals connected to a terminal PN1. The transistors Q3 to Q6 have respective base terminals connected to a terminal PN2. The transistors Q1 and Q5 have respective collector terminals connected to emitter terminals of the transistors Q13 and Q14. The transistors Q2 and Q6 have respective collector terminals connected to emitter terminals of the transistors Q9 and Q10. The transistors Q3 and Q7 have respective collector terminals connected to emitter terminals of the transistors Q15 and Q16. The transistors Q4 and Q8 have respective collector terminals connected to emitter terminals of the transistors Q11 and Q12.

The transistors Q9 and Q12 have respective base terminals connected to a terminal LO1. The transistors Q10 and Q11 have respective base terminals connected to a terminal LO2. The transistors Q13 and Q16 have respective base terminals connected to a terminal LO3. The transistors Q14 and Q15 have respective base terminals connected to a terminal LO4. The transistors Q9 and Q11 have respective collector terminals connected to an end of the resistors R1 and a terminal OUT1. The transistors Q10 and Q12 have respective collector terminals connected to an end of the resistors R2 and a terminal OUT2. The transistors Q13 and Q15 have respective collector terminals connected to an end of the resistors R3 and a terminal OUT3. The transistors Q14 and Q16 have respective collector terminals connected to an end of the resistors R4 and a terminal OUT4.

The other ends of the resistors R1 to R4 are connected to the direct current power source Vc. Furthermore, a single input line of the balun 113 is connected to a terminal RF. Here, the resistors R1 to R4 have the same resistance value.

Each of the terminals PN1 and PN2 receives a PN code generated by the reception PN code generating unit 120 as a balanced signal. Thus, PN1 and PN2 normally receive respective signals having a phase difference by 180 degrees. Thereby, hardly the transistor pair of the transistors Q1 and Q2 and the transistor pair of the transistors Q3 and Q4 are simultaneously turned on.

The terminals LO1 and LO2 receive, as a balanced signal, a local oscillator signal LO_I provided from the local oscillator 117 and having the same phase as that of the reception signal. The terminals LO3 and LO4 receive, as a balanced signal, a local oscillator signal LO_Q that is provided from the phase shifter 115, has a phase difference by approximately 90 degrees, and is orthogonal to the reception signal.

The terminals OUT1 and OUT2 output an in-phase signal I. The terminals OUT3 and OUT4 output a quadrature signal Q.

The terminal RF receives a reception signal received by the reception antenna 111 and amplified by the low noise amplifier 112.

The balun 113 is connected to a current source circuit 201. As described above, since the despreading unit 114 and the quadrature demodulating unit 116 are integrated into a circuit, the current source circuit 201 can supply a current to the balun 113, the despreading unit 114, and the quadrature demodulating unit 116. Thereby, a current to be consumed may be largely reduced, and a size of a chip may be reduced. Furthermore, since a reception signal (or a signal including a demodulated reception signal) is not received by any base terminal of a transistor in the circuit configuration, the distortion of the reception signal can be suppressed.

Figure 8:
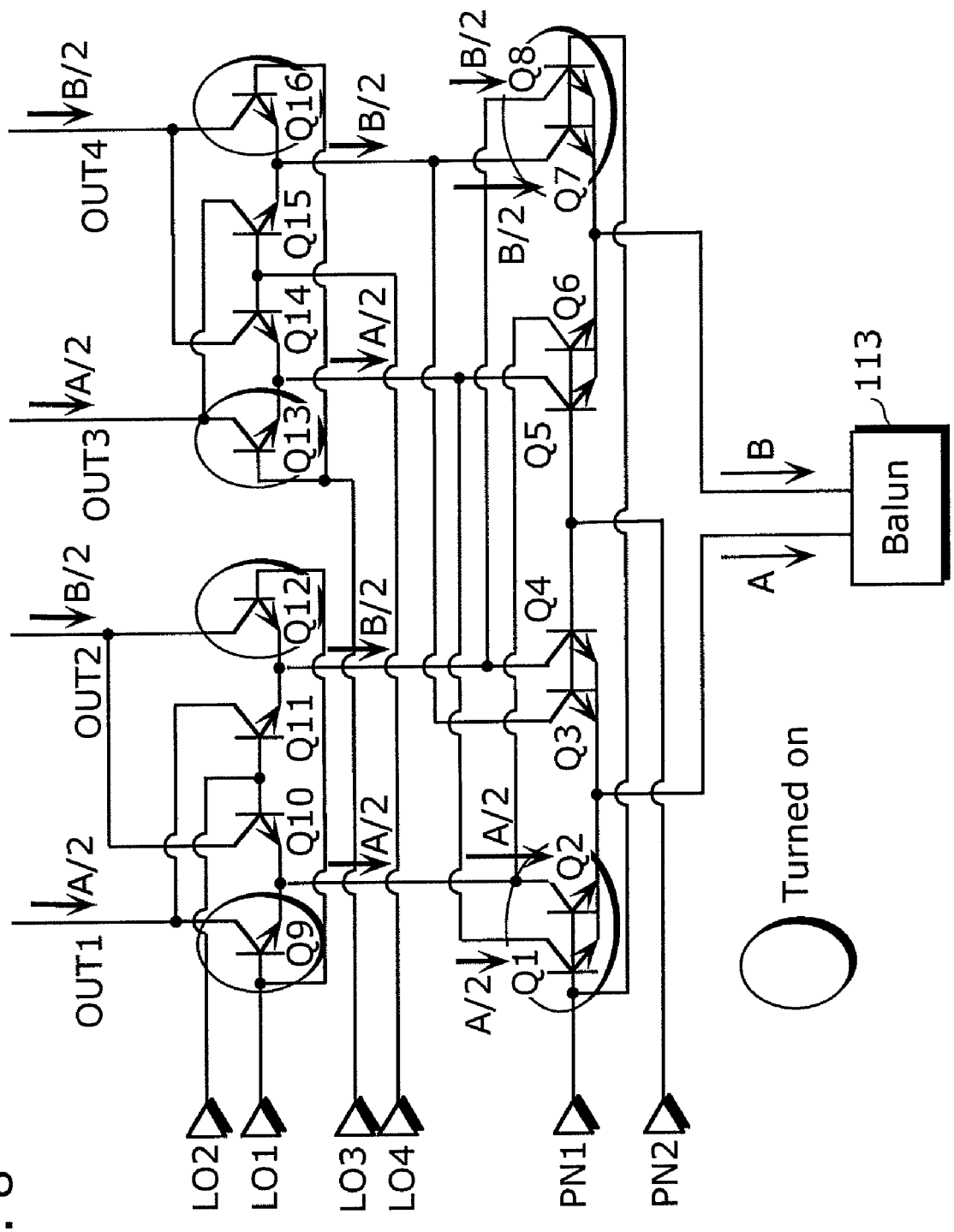
FIG. 8 simply illustrates an operation of the despreading unit and the quadrature demodulator according to the first embodiment.

FIG. 8 simply illustrates operations of the despreading unit 114 and the quadrature demodulating unit 116 that are illustrated in FIG. 7.

In the same manner as a conventional receiving device for a spread spectrum radar apparatus, the balun 113 converts a reception signal from an unbalanced signal into a balanced signal. As illustrated in FIG. 8, currents A and B are carried by balanced output transmission lines of the balun 113. Furthermore, transistors Q1, Q2, Q7, Q8, Q9, Q12, Q13, and Q16 are turned on, and other transistors are turned off.

Emitters of the transistors Q1 and Q2 are connected to each other, and bases of the transistors Q1 and Q2 are connected to each other. In other words, a voltage between the base and emitter of the transistor Q1 is equal to a voltage between the base and emitter of the transistor Q2. Since a value of a collector current that flows through a transistor is determined by a voltage between an emitter and a base of the transistor, values of collector currents that respectively flow through the transistors Q1 and Q2 become equal. Thereby, half of the current A (hereinafter referred to as A/2) flows through the transistors Q1 and Q2, respectively. Emitters of the transistors Q7 and Q8 are connected to each other, and bases of the transistors Q7 and Q8 are connected to each other. Thus, half of the current B (hereinafter referred to as B/2) flows through the transistors Q7 and Q8, respectively.

In the quadrature demodulating unit 116, since the transistor Q9 is turned on and has the emitter terminal connected to the collector terminal of the transistor Q2, the current A/2 flows through the transistor Q9. Similarly, the current B/2 flows through the transistors Q12, the current A/2 flows through the transistor Q13, and the current B/2 flows through the transistors Q16.

As described above, a current that flows through the terminal OUT1 can be equal to a current through OUT3, and a current that flows through the terminal OUT2 can be equal to a current through OUT4, by employing a circuit configuration in which 2 transistors included in a transistor pair are connected to each other through the respective bases and emitters, regardless of variations in a DC voltage level of a local oscillator signal of the quadrature demodulating unit 116. Thereby, intensity of an in-phase balanced signal transmitted from the terminals OUT1 and OUT2 can be equal to intensity of a quadrature balanced signal transmitted from the terminals OUT3 and OUT4. In other words, according to Equation 4, the intensity $P_1$ is equal to that of $P_2$, and a sum of squares of the in-phase balanced signal and the quadrature balanced signal is kept constant, regardless of a phase $\phi$ of a reception signal. Thus, the intensity of the reception signal becomes stable and a precise radar spectrum can be obtained.

As described above, the receiving device for the spread spectrum radar apparatus according to the first embodiment includes the despreading unit 114 configured by adding, to the 4 transistors included in the conventional despreading unit 303, another 4 transistors. The 4 conventional transistors are respectively paired with the 4 additional transistors to arrange 4 transistor pairs, and the paired 2 transistors that compose one of the 4 transistor pairs are connected to each other through the respective bases and emitters so as to match a sum of currents that flow through the balanced modulator 116a that generates an in-phase signal and a sum of currents that flow through the balanced modulator 116b that generates a quadrature signal. In other words, the despreading unit 114 includes the 4 transistor pairs each of which includes the 2 transistors that are connected to each other through the respective bases and emitters. Thus, intensity of a reception signal becomes stable, and a precise radar spectrum can be obtained. Furthermore, similarly as the conventional receiving devices, according to the first embodiment, each of a despreading unit and a quadrature demodulating unit is configured of a switching circuit that functions as a double balanced I/O switching circuit, and a current source circuit is shared between the despreading unit and the quadrature demodulating unit. Thus, electric power to be consumed and a size of a chip can be reduced.

Second Embodiment

A receiving device for a spread spectrum radar apparatus of a second embodiment amplifies intensity of a signal of a PN code received by a despreading unit, by inserting a differential amplifier between a reception PN code generating unit and the despreading unit.

Figure 9:
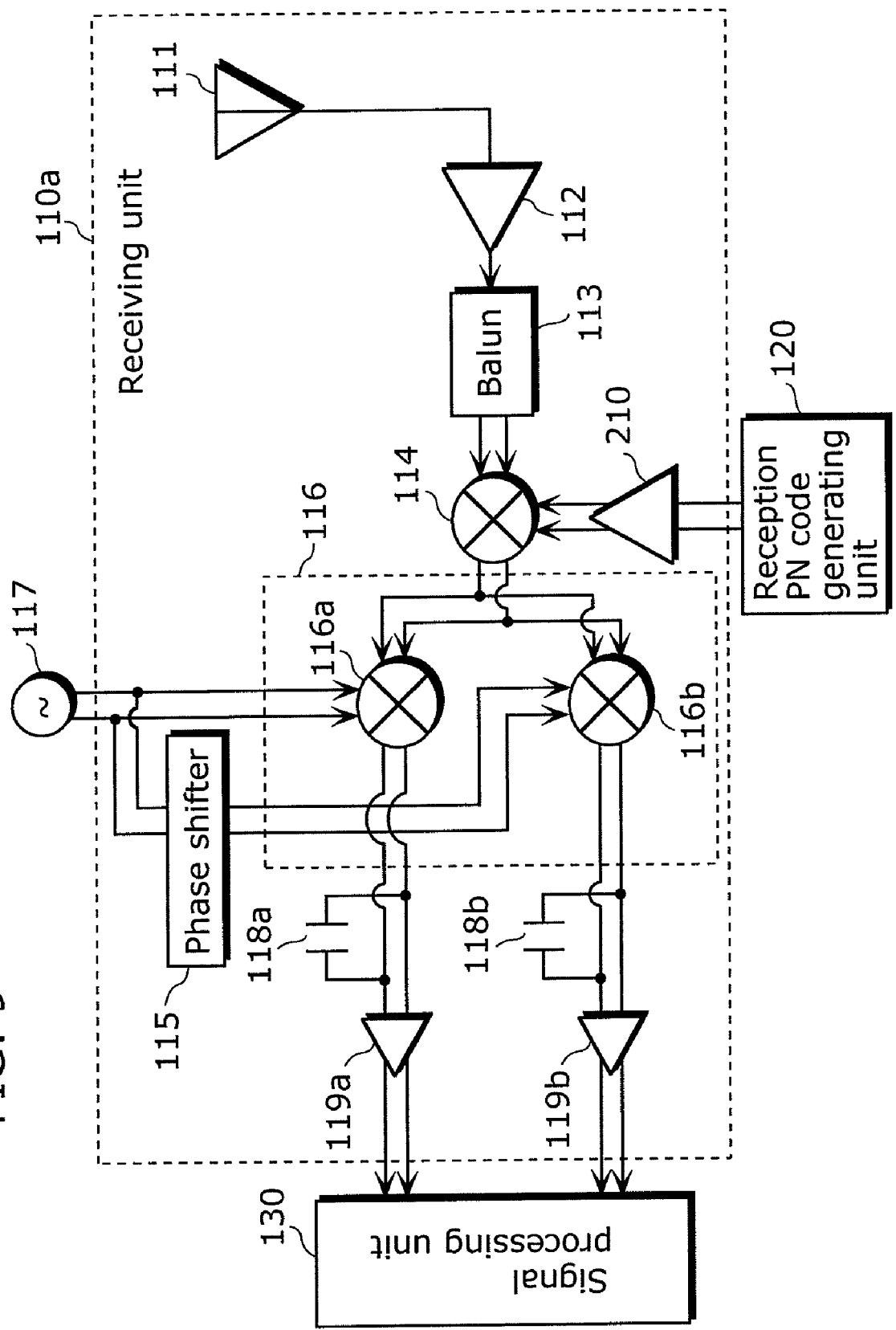
FIG. 9 illustrates a circuit configuration of a receiving unit included in a receiving device for a spread spectrum radar apparatus according to the second embodiment.

FIG. 9 illustrates a configuration of a receiving device 110a of the second embodiment. The receiving device 110a here differs from the receiving device 110 in FIG. 5 in adding a differential amplifier 210. The following mainly describes the difference by omitting the description of the same characteristics and functions as those of the receiving device 110 in FIG. 5. Here, constituent elements in FIG. 9 identical to those of FIG. 5 are numbered in the same manner as in FIG. 5.

The receiving unit 110a in FIG. 9 adds, to the constituent elements in FIG. 5, the differential amplifier 210 between the reception PN code generating unit 120 and the despreading unit 114.

Figure 10:
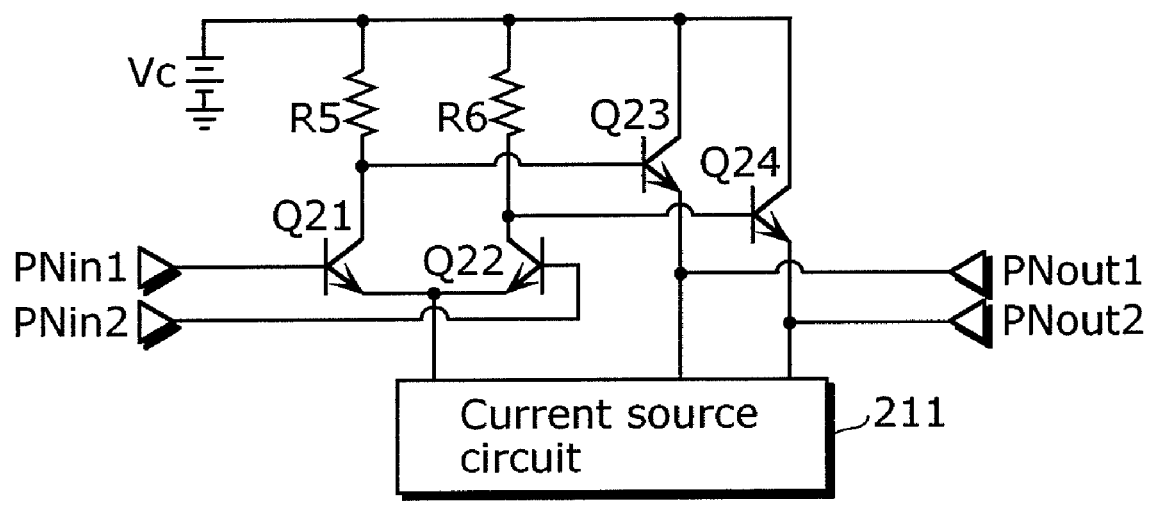
FIG. 10 illustrates a circuit configuration of a differential amplifier according to the second embodiment.

FIG. 10 illustrates a circuit configuration of the differential amplifier 210. The differential amplifier 210 includes transistors Q21 to Q24, resistors R5 and R6, a direct current power source Vc, and a current source circuit 211.

The transistor Q21 has a base terminal connected to a terminal PNin1. The transistor Q21 has a collector terminal connected to a base terminal of the transistor Q23 and to an end of the resistor R5. The transistor Q21 has an emitter terminal connected to an emitter terminal of the transistor Q22 and to the current source circuit 211. The transistor Q22 has a base terminal connected to a terminal PNin2. The transistor Q22 has a collector terminal connected to a base terminal of the transistor Q24, and to an end of the resistor R6. The transistor Q23 has a collector terminal connected to a collector terminal of the transistor Q24, to the other ends of the resistors R5 and R6, and to the direct current power source Vc. The transistors Q23 has an emitter terminal connected to a terminal PNout1 and to the current source circuit 211. The transistors Q24 has an emitter terminal connected to a terminal PNout2 and to the current source circuit 211. The other end of the direct current power source Vc is grounded.

Thereby, a balanced signal of a PN code provided from the terminals PNout1 and PNout2 is amplified by the circuit illustrated in FIG. 10 so that the terminals PNout1 and PNout2 supply the amplified signal. The despreading unit 114 is a non-linear circuit. When intensity of a local signal (here, PN code) is smaller, a gain of the non-linear circuit increases in proportion to the intensity of the local signal. In contrast, when intensity of a local signal exceeds a certain threshold, the non-linear circuit has a saturation property that a gain of the non-linear circuit is saturated and becomes constant. Even when intensity of local signals has some variations, a gain needs to be kept constant during operations of the spread spectrum radar apparatus. Thus, the intensity of local signals in the non-linear circuit needs to be set to intensity for operating the non-linear circuit in a saturation region. Insertion of the differential amplifier 210 between the reception PN code generating unit 120 and an input terminal PN that is included in the despreading unit 114 allows the intensity of local signals to be set so that the despreading unit 114 can operable in a saturation region.

Furthermore, when an output DC voltage level of the reception PN code generating unit 120 in the receiving device in FIG. 5 does not match an input DC voltage level of the terminals PN1 and PN2 in FIG. 7, a large capacitor for removing a DC voltage component needs to be connected between the reception PN code generating unit 120 and the despreading unit 114 and outside thereof. Here, the output DC voltage level of the reception PN code generating unit 120 does not influence the input DC voltage level of the terminals PN1 and PN2 in FIG. 7 by inserting the differential amplifier 210. The input DC voltage level of the terminals PN1 and PN2 in FIG. 7 corresponds to the output DC voltage level of the terminals PNout1 and PNout2 in FIG. 10. The input DC voltage level of the terminals PNout1 and PNout2 depends on parameters, such as: a voltage drop in the direct current power source Vc and in the resistors R5 and R6; and a voltage between an emitter and a base of the transistor Q23 and a voltage between an emitter and a base of the transistor Q24. Thereby, a differential amplifier in a circuit of a chip can set a DC voltage level of a local signal input unit included in a despreading unit, regardless of an output DC voltage level of a reception PN code generating unit, without a large capacitor for removing a DC voltage component.

As described above, the receiving device 110a for the spread spectrum radar apparatus of the second embodiment can amplify intensity of local signals by inserting the differential amplifier 210 between the reception PN code generating unit 120 and a local signal input unit of the despreading unit 114. Thereby, the despreading unit configured as a non-linear circuit can operate in a saturation region. Furthermore, such a circuit does not have to use a large capacitor that removes a DC voltage component and that is connected outside.

Although the receiving device for the spread spectrum radar apparatus according to the first and second embodiments of the present invention is described, the present invention is not limited to these embodiments.

For example, although the transistors are bipolar transistors in the embodiments, but may be hetero bipolar transistors. Furthermore, field effect transistors may be used. In this case, the base in the embodiments is defined to be a gate, the emitter as a source, and the collector as a drain.

Furthermore, in the embodiments, the balun 113, the despreading unit 114, and the quadrature demodulating unit 116 are integrated into a circuit and are formed on a semiconductor substrate as a set. In contrast, the capacitors 118a and 118b, the buffer amplifiers 119a and 119b, and the differential amplifier 210 may additionally be formed on the semiconductor substrate.

Although the reception signal is converted into the balanced signal in the embodiments, the reception signal may be used as an unbalanced signal without performing any processing thereon. In this case, the number of transistors to be used may be reduced.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention may be used as a receiving device for a spread spectrum radar apparatus, for example, for a radar apparatus to be installed in a vehicle. The receiving device can reduce electric power to be consumed and a size of a chip, and can obtain a precise radar spectrum having a stable intensity of a reception signal at its peak.

What is claimed is:

1. A receiving device that is used for a spread spectrum radar apparatus and receives a spectrum-spread signal, said receiving device comprising:
a signal receiving unit configured to receive the spectrum-spread signal as a reception signal;
a despreading unit configured to generate a first despread signal and a second despread signal that are generated by despreading, using a pseudo-noise code, the reception signal received by said signal receiving unit, the second despread signal passing through a transmission line carrying a current having a current value identical to a current value of a current carried by a transmission line through which the first despread signal passes; and
a quadrature demodulating unit configured to generate an in-phase signal by quadrature-demodulating the first despread signal, and a quadrature signal by quadrature-demodulating the second despread signal,
wherein said despreading unit includes a first transistor pair including a first transistor and a second transistor, said first and second transistors having an identical characteristic,
said first and second transistors receive the reception signal, and despread the received reception signal by being turned on and off according to the pseudo-noise code, subsequently said first transistor outputs the first despread signal, and said second transistor outputs the second despread signal, and
said quadrature demodulating unit includes:
a first demodulator that demodulates the first despread signal using a first local oscillator signal, and generates the in-phase signal; and
a second demodulator that demodulates the second despread signal using a second local oscillator signal having a phase obtained by shifting a phase of the first local oscillator signal by 90 degrees, and generates the quadrature signal.

2. The receiving device according to claim 1,
wherein either (i) a base of said first transistor is connected to a base of said second transistor, and an emitter of said first transistor is connected to an emitter of said second transistor, or (ii) a gate of said first transistor is connected to a gate of said second transistor, and a source of said first transistor is connected to a source of said second transistor.

3. The receiving device according to claim 1,
wherein said signal receiving unit is configured to convert the received spectrum-spread signal into a balanced reception signal including a positive reception signal and a negative reception signal,
the first despread signal is a balanced signal including a first positive despread signal and a first negative despread signal,
the second despread signal is a balanced signal including a second positive despread signal and a second negative despread signal,
said despreading unit further includes a second transistor pair having a structure identical to a structure of said first transistor pair,
said first transistor pair receives the positive reception signal, despreads the received positive reception signal by being turned on and off according to the pseudo-noise code, and outputs the first positive despread signal and the second positive despread signal, and
said second transistor pair receives the negative reception signal, despreads the received negative reception signal by being turned on and off according to the pseudo-noise code, and outputs the first negative despread signal and the second negative despread signal.

4. The receiving device according to claim 3,
wherein the pseudo-noise code is a balanced pseudo-noise code including a positive pseudo-noise code and a negative pseudo-noise code,
said despreading unit further includes a third transistor pair and a fourth transistor pair each having a structure identical to the structure of said first transistor pair,
said first transistor pair despreads the positive reception signal by being turned on and off according to the positive pseudo-noise code, and outputs the first positive despread signal and the second positive despread signal, and
said second transistor pair despreads the negative reception signal by being turned on and off according to the positive pseudo-noise code, and outputs the first negative despread signal and the second negative despread signal, and said third transistor pair receives the positive reception signal, despreads the received positive reception signal by being turned on and off according to the negative pseudo-noise code, and outputs the first negative despread signal and the second negative despread signal, and said fourth transistor pair receives the negative reception signal, despreads the received negative reception signal by being turned on and off according to the negative pseudo-noise code, and outputs the first positive despread signal and the second positive despread signal.

5. The receiving device according to claim 3, further comprising:

a code generating unit configured to generate the pseudo-noise code; and an amplifier circuit that amplifies the pseudo-noise code and provides the amplified pseudo-noise code to said despreading unit.

6. The receiving device according to claim 3, wherein said signal receiving unit includes a balun that converts the received spectrum-spread signal into the balanced reception signal, and provides the converted reception signal to said despreading unit, and said balun includes passive elements.

7. The receiving device according to claim 6, wherein said balun includes:

a first transmission line having an end that receives the spectrum-spread signal that is an unbalanced signal, and having an other end that is grounded; and a second transmission line and a third transmission line that are electromagnetically coupled to the first transmission line, wherein an end of said second transmission line and an end of said third transmission line are grounded, the positive reception signal is outputted from an other end of said second transmission line, and the negative reception signal is outputted from an other end of said third transmission line, the other end of said second transmission line facing the other end of said third transmission line.

8. The receiving device according to claim 1, further comprising:

a first capacitor coupled in parallel with an output transmission line of said first demodulator, said first capacitor removing a high frequency component from the in-phase signal; and a second capacitor coupled in parallel with an output transmission line of said second demodulator, said second capacitor removing a high frequency component from the quadrature signal.

9. The receiving device according to claim 1, wherein said despreading unit and said quadrature demodulating unit are integrated in a circuit that includes a current source to be shared between said despreading unit and said quadrature demodulating unit, and are formed on an identical semiconductor substrate.

10. The receiving device according to claim 1, wherein said first and second transistors are hetero bipolar transistors.

11. A semiconductor device that is used for a receiving device included in a spread spectrum radar apparatus and receives a spectrum-spread signal, said semiconductor device comprising:

a signal receiving unit configured to receive the spectrum-spread signal as a reception signal;

a despreading unit configured to generate a first despread signal and a second despread signal that are generated by despreading, using a pseudo-noise code, the reception signal received by said signal receiving unit, the second despread signal passing through a transmission line carrying a current having a current value identical to a current value of a current carried by a transmission line through which the first despread signal passes; and a quadrature demodulating unit configured to generate an in-phase signal by quadrature-demodulating the first despread signal, and a quadrature signal by quadrature-demodulating the second despread signal, wherein said despreading unit includes a first transistor pair including a first transistor and a second transistor, said first and second transistors having an identical characteristic, said first and second transistors receive the reception signal, and despread the received reception signal by being turned on and off according to the pseudo-noise code, subsequently said first transistor outputs the first despread signal, and said second transistor outputs the second despread signal, said quadrature demodulating unit includes:

a first demodulator that demodulates the first despread signal using a first local oscillator signal, and generates the in-phase signal; and a second demodulator that demodulates the second despread signal using a second local oscillator signal having a phase obtained by shifting a phase of the first local oscillator signal by 90 degrees, and generates the quadrature signal.

* * * * *